US009545037B2

(12) United States Patent
Tyleshevski et al.

(10) Patent No.: US 9,545,037 B2
(45) Date of Patent: Jan. 10, 2017

(54) SYSTEMS AND METHODS FOR COOLING ELECTRIC DRIVES

(71) Applicant: Baker Hughes Incorporated, Houston, TX (US)

(72) Inventors: Nicholas J. Tyleshevski, Owasso, OK (US); Keith D. Kabrich, Talala, OK (US); Patrick B. Cochran, Claremore, OK (US); Don L. Inman, Claremore, OK (US); Gary D. Harrison, Claremore, OK (US); Gary L. Collins, Tulsa, OK (US)

(73) Assignee: Baker Hughes Incorporated, Houston, TX (US)

( * ) Notice: Subject to any disclaimer, the term of this patent is extended or adjusted under 35 U.S.C. 154(b) by 225 days.

(21) Appl. No.: 14/596,346

(22) Filed: Jan. 14, 2015

(65) Prior Publication Data

US 2015/0216073 A1  Jul. 30, 2015

Related U.S. Application Data

(60) Provisional application No. 61/931,480, filed on Jan. 24, 2014.

(51) Int. Cl.
*H05K 7/20* (2006.01)

(52) U.S. Cl.
CPC .......... *H05K 7/20909* (2013.01); *H05K 7/202* (2013.01); *H05K 7/206* (2013.01); *H05K 7/20136* (2013.01); *H05K 7/20145* (2013.01)

(58) Field of Classification Search
CPC  H05K 7/20136; H05K 7/20145; H05K 7/202; H05K 7/2039–7/20409; H05K 7/206–7/20609; H05K 7/20754; H05K 7/20909–7/20918

See application file for complete search history.

(56) References Cited

U.S. PATENT DOCUMENTS 3,601,185 A * 8/1971 Rothman ............... F28D 9/0062
165/166
4,379,109 A * 4/1983 Simpson ................. B32B 18/00
156/89.22
6,119,768 A * 9/2000 Dreier .................... H05K 7/206
165/103

(Continued)

*Primary Examiner* — Robert J Hoffberg
(74) *Attorney, Agent, or Firm* — Law Offices of Mark L. Berrier

(57) ABSTRACT

Systems and methods for cooling a drive for downhole electric equipment such as an ESP, wherein the drive's electrical components are contained in one or more sealed enclosures to protect them from contaminants in external cooling air. In one embodiment, the drive has two sealed compartments that contain electrical components. Air internal to these compartments is circulated through air-to-air heat exchangers that are positioned in an adjacent duct. Alternating horizontal and vertical passageways through the heat exchangers are formed by flat plates that are offset from each other and connected alternately at their top/bottom and side edges. Air external to the sealed compartments is circulated through the duct to cool the heat exchangers. The amount of air circulated through each heat exchanger may be controlled by valves that regulate airflow through one or more outlets from the duct.

15 Claims, 8 Drawing Sheets

(56) References Cited

U.S. PATENT DOCUMENTS

| | | | | |
|---|---|---|---|---|
| 6,742,583 B2* | 6/2004 | Tikka | ............... | H05K 7/206 165/261 |
| 7,059,149 B2* | 6/2006 | Wahlberg | ............... | H05K 7/202 165/104.18 |
| 7,436,660 B2* | 10/2008 | Pedoeem | ............... | H04L 12/18 165/80.3 |
| 8,316,542 B2* | 11/2012 | Imai | ............... | F24F 3/147 165/133 |
| 8,654,302 B2* | 2/2014 | Dunn | ............... | G02F 1/133385 165/104.34 |
| 9,062,890 B2* | 6/2015 | Benoit | ............... | F24F 12/006 |
| 9,119,325 B2* | 8/2015 | Dunn | ............... | G02F 1/133385 |
| 9,119,330 B2* | 8/2015 | Hubbard | ............... | G02F 1/133308 |
| 9,222,731 B2* | 12/2015 | Dinulescu | ............... | B21D 51/52 |
| 9,273,907 B2* | 3/2016 | Dinulescu | ............... | F28D 9/0037 |
| 2006/0243423 A1* | 11/2006 | Giacoma | ............... | F28D 9/00 165/104.14 |
| 2008/0105418 A1* | 5/2008 | Takada | ............... | F24F 3/147 165/166 |
| 2008/0112135 A1* | 5/2008 | Kleinecke | ............... | H05K 7/206 361/696 |
| 2010/0178157 A1* | 7/2010 | Arai | ............... | F24F 12/006 415/115 |
| 2011/0203770 A1* | 8/2011 | Rowe | ............... | H05K 7/202 165/80.1 |
| 2013/0153184 A1* | 6/2013 | Rolt | ............... | F28F 3/046 165/166 |
| 2015/0022972 A1* | 1/2015 | Kwon | ............... | F24F 7/007 361/690 |
| 2015/0195959 A1* | 7/2015 | Hubbard | ............... | G02F 1/133308 361/692 |
| 2015/0285255 A1* | 10/2015 | Tsujimoto | ............... | H02M 7/003 417/44.1 |
| 2016/0128229 A1* | 5/2016 | Pallasmaa | ............... | H05K 7/20127 363/123 |

* cited by examiner

SYSTEMS AND METHODS FOR COOLING ELECTRIC DRIVES

CROSS-REFERENCE TO RELATED APPLICATIONS

This application claims the benefit of U.S. Provisional Patent Application 61/931,480, filed Jan. 24, 2014, which is incorporated by reference as if set forth herein in its entirety.

BACKGROUND

Field of the Invention

The invention relates generally to power subsystems for downhole equipment such as electrical submersible pumps (ESP's), and more particularly to means for cooling electric drive systems in harsh environments while preventing introduction of contaminants into the drive systems.

Related Art

Downhole equipment such as ESP systems are commonly installed in wells for purposes of producing fluids (e.g., oil) from the wells. Typically, AC power from an external source such as a power grid is converted by an electric drive system to DC power, which is in turn converted to AC power that is suitable to drive the downhole equipment. This AC power is delivered to the equipment via power cables that extend into the wells.

The electric drive for an ESP system is normally located at the surface of the well. Heat generated by the drive in the process of rectifying the input power and producing the AC output power is typically dissipated by circulating ambient cooling air through the drive. In some cases, wells are drilled in locations such as deserts, where there may be a great deal of sand and dust in the ambient air that is circulated through the drive. The sand and dust may accumulate in the drive, reducing its ability to dissipate heat.

Conventionally, this problem may be addressed by implementing a thermoelectric cooling system to help dissipate the generated heat. These systems, however, require constant power input to provide a cooling effect, and they are notoriously inefficient, so they consume large amounts of power to remove nominal amounts of heat. Although not implemented in current systems, it would be possible to provide a system that uses a working fluid and turbomachinery, such as a vapor-compression system, to cool the drive components. While this type of cooling system would likely be more efficient than a thermoelectric system, it would be much more prone to maintenance, which would be undesirable. Another option that is not currently used would be to filter the ambient air before it is circulated through the drive. In some cases, however, a portion of the sand and dust particles are small enough that they cannot be easily filtered out of the ambient air. Filters that are capable of eliminating these fine particulates would typically impede the flow of the cooling air, making this an impractical solution.

It would therefore be desirable to provide an inexpensive, efficient, low-maintenance thermal management solution for sealed electric drive systems that must operate in contaminated environments for prolonged periods of time.

SUMMARY OF THE INVENTION

Embodiments of the present invention include systems and methods for thermal management in electric drive systems that are used in connection with downhole electric equipment. In one embodiment, a variable speed drive is used to provide power which drives an electric submersible pump (ESP) system. The drive is located at the surface of a well in which the ESP is installed, and is coupled via a power cable to the downhole equipment.

Embodiments of the present invention include systems and methods for cooling a sealed drive for downhole electric equipment such as an ESP. The drive's electrical components are contained in sealed enclosures that protect these components from contaminants that are present in the cooling air external to the sealed compartments. Air internal to the sealed compartments is circulated through air-to-air heat exchangers that are positioned in an adjacent duct. External air is forced into the duct where it flows through the heat exchangers. The heat exchangers may be crossflow-type heat exchangers, and may have any suitable configuration, such as shell-and-tube designs or designs that are formed by flat plates which are interconnected to form alternating horizontal and vertical passageways. Internal air from the sealed compartments may, for example, flow through the horizontal passageways while the external cooling air flows through the vertical passageways. Heat flows from the internal air, through the plates to the external air, which flows out of the duct to remove heat from the drive.

In one particular embodiment, a sealed drive system for downhole electric equipment includes one or more electrical components which are configured to produce an electrical output waveform that drives the downhole electric equipment. The electrical components are contained in one or more sealed compartments formed by a drive enclosure. The sealed compartments prevent air external to the compartments from entering the sealed compartments. Each of the sealed compartments has a heat exchanger coupled to it to remove heat from the compartment without allowing external air to enter the sealed compartment.

In one embodiment, the enclosure forms two or more sealed compartments, where each compartment contains one or more of the electrical components. For instance, a set of switching components may be contained in one sealed compartment, while a set of link reactors are contained in a second sealed compartment. Each sealed compartment has a separate heat exchanger. The heat exchangers may be crossflow-type air-to-air heat exchangers. Each of these heat exchangers may have a crossflow portion with a first set of passageways for air internal to the sealed compartment and a second set of passageways for external air flow. The heat exchanger may have a series of plates, each of which has a substantially flat central portion. The central portions of the plates are substantially parallel and are offset from each other to form the walls of the passageways. In one embodiment, each of the plates is identical, and has pairs of connecting portions on opposite edges of the plate which allow the plates to be connected to each other. The central portions of the plates may have fins, corrugations or other features to facilitate heat transfer through the plates from the internal air to the external air.

Numerous other embodiments are also possible.

BRIEF DESCRIPTION OF THE DRAWINGS

Other objects and advantages of the invention may become apparent upon reading the following detailed description and upon reference to the accompanying drawings.

Figure 1:
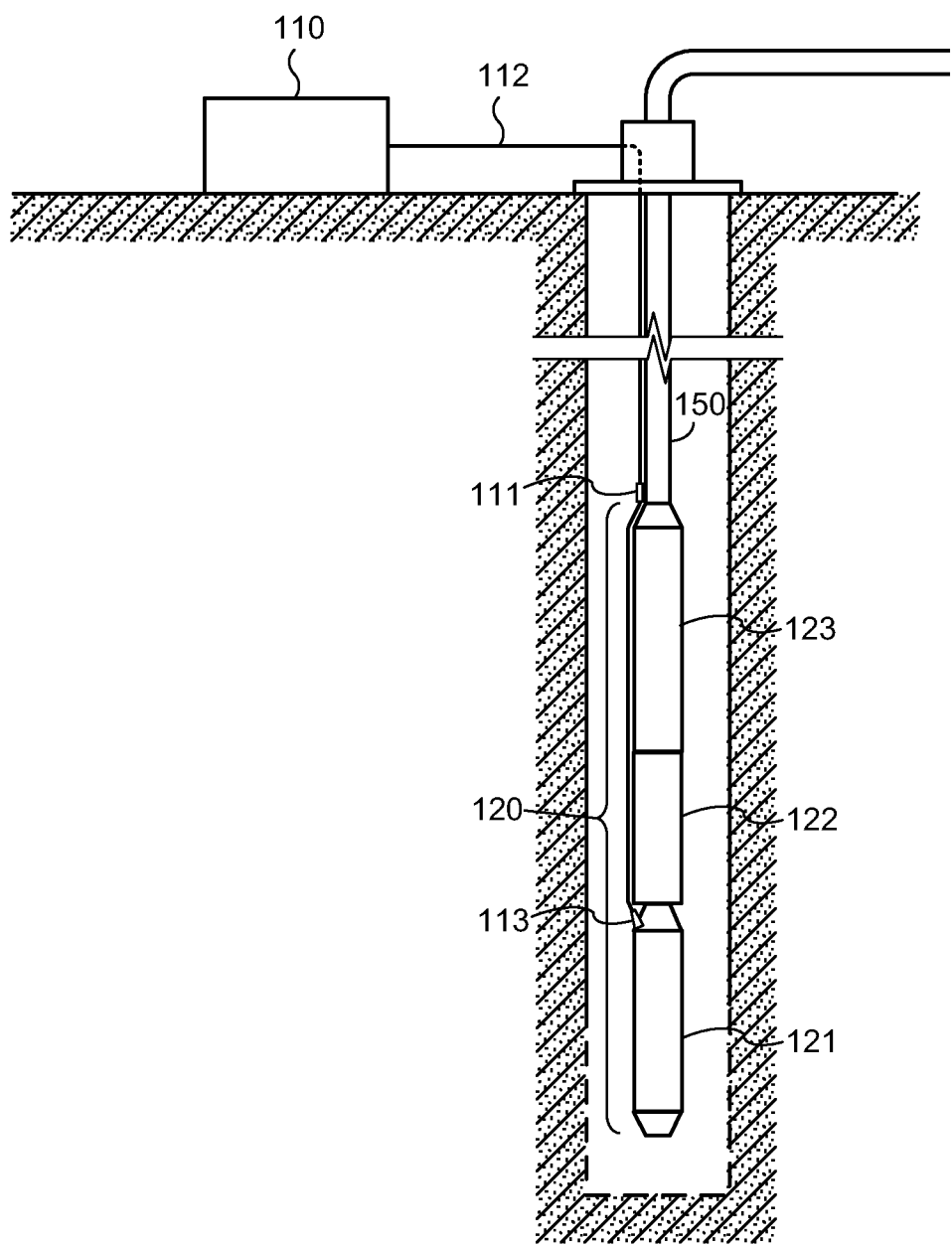
FIG. 1 is a diagram illustrating an exemplary ESP system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims. Further, the drawings may not be to scale, and may exaggerate one or more components in order to facilitate an understanding of the various features described herein.

DESCRIPTION OF EXEMPLARY EMBODIMENTS

One or more embodiments of the invention are described below. It should be noted that these and any other embodiments described below are exemplary and are intended to be illustrative of the invention rather than limiting.

Embodiments of the present invention include power subsystems for downhole equipment such as electrical submersible pumps (ESP's), where components of an electric drive system are contained in one or more sealed compartments to prevent the introduction of contaminants into the drive when it is operating in a harsh environment.

In one embodiment, the electric drive is a variable speed drive (VSD). The drive has electric components (e.g., IGBT's—insulated-gate bipolar transistors, SCR's—silicon controlled rectifiers, link reactors, and the like) that are used to convert power received from an external power source to a form that is suitable to drive the downhole equipment. The electric components are contained in one or more sealed compartments of a drive housing. A heat exchanger is provided for each sealed compartment to cool the air within the compartment without allowing the air inside the sealed compartment to be come into contact with contaminants in the external, ambient air. The heat exchangers may be, for example, crossflow-type air-to-air heat exchangers. Internal air from the sealed compartments is circulated through one set of passageways, while ambient air external to the sealed compartments is circulated through a second set of passageways that are interleaved with the first set of passageways.

In one embodiment, a portion of the electric components are mounted on a wall of the sealed compartments that serves as a heat sink. A duct is provided external to the sealed compartments adjacent to the heat sink wall. The duct is configured to cause ambient air flow across the heat exchangers. A fan is positioned to generate air flow into the duct, where the air flow is initially directed toward the heat sink wall, and is then split into an upper flow that is directed across an upper one of the heat exchangers, and a lower flow that through is directed across a lower one of the heat exchangers. A flapper valve is provided at a lower end of the duct to seal the duct when cooling air is not being forced through the duct. The flapper valve can also be used to control the lower air flow, thereby balancing the upper and lower air flows through the duct.

Referring to FIG. 1, a diagram illustrating an exemplary ESP system in which one embodiment of the present invention may be installed is shown. In this embodiment, an ESP system is installed in a well for the purpose of producing oil, gas or other fluids. An ESP 120 is coupled to the end of tubing string 150, and the ESP and tubing string are lowered into the wellbore to position the ESP in a producing portion of the well (as indicated by the dashed lines at the bottom of the wellbore). Surface equipment that includes a drive system 110 is positioned at the surface of the well. Drive system 110 is coupled to ESP 120 by power cable 112, which runs down the wellbore along tubing string 150. Tubing string 150 and power cable 112 may range from less than one thousand feet in a shallow well, to many thousands of feet in a deeper well.

ESP 120 includes a motor section 121, seal section 122, and pump section 123. ESP 120 may include various other components. Motor section 121 is operated to drive pump section 123, thereby pumping the oil or other fluid through the tubing string and out of the well. Drive system 110 produces power (e.g., three-phase AC power) that is suitable to drive motor section 121. This output power is provided to motor section 121 via power cable 112.

Power cable 112 extends downward along the tubing string from the drive unit at the surface of the well to a point near the ESP. At this point (typically 10-50 feet above the ESP), the primary cable is connected to the motor lead by a splice 111. The motor lead extends from the primary cable to the motor, and is connected to the motor by a pothead connector 113. Pothead connector 113 is mated with a set of power terminals of the motor, and the pothead connector is secured to the motor housing.

Figure 2:
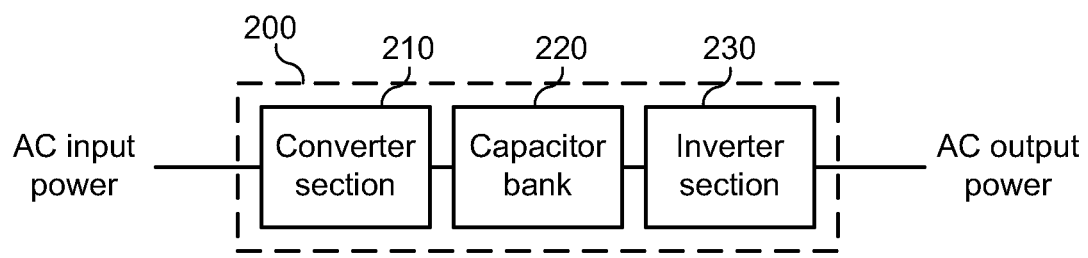
FIG. 2 is a functional block diagram illustrating the structure of a variable speed drive in accordance with one embodiment.

Referring to FIG. 2, a functional block diagram of a typical electric drive system for an ESP system is shown. The drive may, for instance, be a variable speed drive that is suitable for providing power to downhole equipment such as electric submersible pump systems. As depicted in FIG. 2, drive 200 includes a converter section 210, a first capacitor bank 220, and an inverter section 230. Converter section 210 receives AC input power from a source such as an external power grid. Converter section 210 rectifies the AC power and uses the rectified power to charge capacitor bank 220 to a substantially constant voltage. Capacitor bank 220 is coupled to an inverter section 230. Inverter section 230 inverts the DC power on the capacitor bank to produce an output waveform that approximates or simulates a sine wave. Inverter section 230 may be configured to operate in a six-step mode or a pulse width modulation mode.

Figure 3:
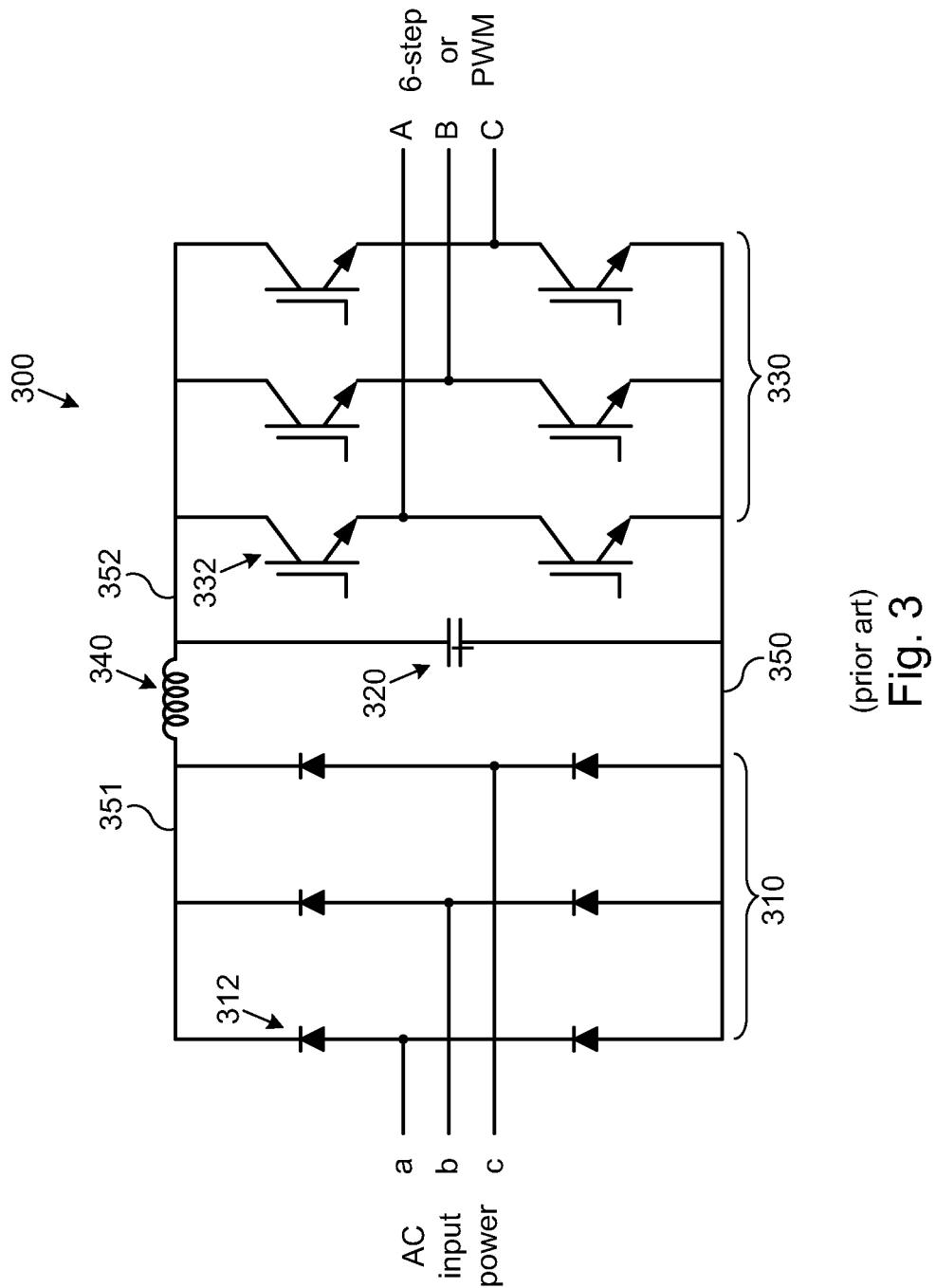
FIG. 3 is a more detailed diagram illustrating the structure of a variable speed drive in one embodiment.

FIG. 3 is a diagram showing in greater detail the structure of an exemplary variable speed drive. Variable speed drive 300 has a converter section 310, a capacitor bank 320, and an inverter section 330. Converter section 310 has three pairs of diodes (e.g., 312). Each pair of diodes is connected in series between upper rail 351 and lower rail 350. The junction of each pair of diodes is connected to one of the three phases (a-c) of an external power source (not shown). The diodes rectify the input AC power and charge capacitor bank 320. The diodes of converter 310 could be replaced by switches or other components as known in the art.

A link reactor 340 is connected between upper rail 351 and the positive terminal of capacitor bank 320 to reduce the AC component of the rectified voltage output by converter 310. The charge on capacitor bank 320 is used by inverter 330 to produce an output waveform that is suitable to drive an ESP motor. In the embodiment of FIG. 3, inverter 330 has three pairs of switches (e.g., 332). Each pair of switches is connected in series between an upper rail 352 and lower rail 350. Each pair of switches in the inverter is controlled in this embodiment to produce a separate phase (A-C) of a three-phase output waveform. The junction of each pair of switches is therefore connected to a different one of the conductors of a three-phase output power cable so that it can be provided to the ESP motor.

As variable speed drive 300 is operated, heat is generated by the various electrical components in the drive. This heat must be dissipated in order to prevent damage to the drive and reduction of the useful life of the drive. Typically, the heat generated by the drive (which is positioned at the surface of a well) is dissipated by passing ambient air through the drive. There may be situations, however, in which this is not an acceptable solution.

For instance, some wells are drilled in locations such as deserts, where there may be a great deal of sand and dust in the air that is passed through the electric drive. The sand and dust may accumulate in the drive, reducing its ability to dissipate heat. While it is possible to filter the air before it is circulated through the drive, some of the sand and dust particles are so small that they cannot be effectively filtered out of the air without substantially impeding the flow of the air through the drive. In locations in which these extremely fine particulates are common, it is necessary to employ a different means for cooling the drive.

One such means is a sealed-compartment drive that uses heat exchangers to transfer heat from a sealed inner compartment to an area external to the compartment, where it can be dissipated by ambient air (air external to the drive) that may be contaminated with fine particulates. The structure of an exemplary sealed-compartment drive is illustrated in FIGS. 4-5.

Figure 4:
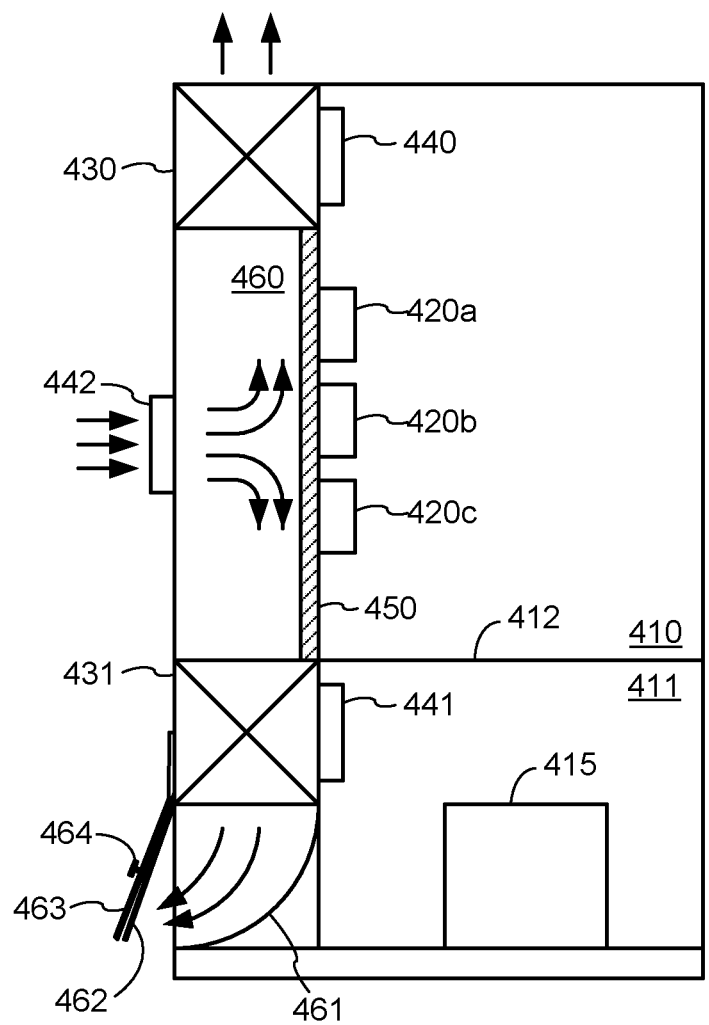
FIG. 4 is a cross-sectional view of a sealed-compartment drive in accordance with one embodiment.
Figure 5:
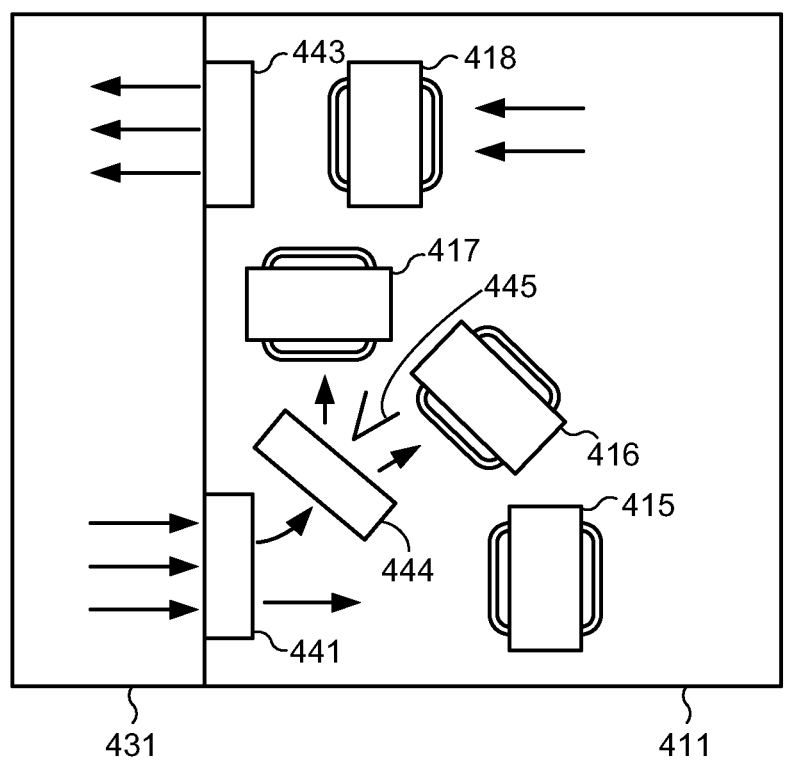
FIG. 5 is a diagram illustrating the arrangement of components within a lower compartment of a sealed-compartment drive in accordance with one embodiment.

Referring to FIG. 4, a cross-sectional view of a sealed-compartment drive in accordance with one embodiment is shown. In this embodiment, drive 400 includes two separate sealed compartments (410, 411). In other embodiments, there may be a single sealed compartment, or more than two compartments. The floor (412) of upper compartment 410 separates the upper compartment from lower compartment 411. Floor 412 is not insulated in this embodiment, but could be insulated in alternative embodiments. The separation of the two sealed compartments allows components such as link reactors (e.g., 415) and capacitors (not shown in the figure) that generate a substantial amount of heat to be positioned in the lower compartment, separate from components in the upper compartment, such as circuit boards (e.g., system control board, inverter/converter signal boards, etc.) power electronics (e.g., 420a, 420b, 420c) that generate less heat and may be more susceptible to heat damage.

Each of compartments 410 and 411 has a heat exchanger (430 and 431, respectively). Heat exchangers 430 and 431 are crossflow-type air-to-air heat exchangers, which require little or no maintenance. The air inside each compartment is circulated through the heat exchangers by one or more fans at the inlet and outlet of the heat exchangers. As depicted in the figure, fan 440 circulates air from compartment 410 through heat exchanger 430, while fan 441 circulates air from compartment 411 through heat exchanger 431. Additional fans and/or other means may be used to circulate air across the heat generating components within the respective compartments. Power electronics 420a, 420b, 420c, such as insulated gate bipolar transistors (IGBTs) or silicon controlled rectifiers (SCRs) are mounted on a wall 450 of compartment 410 that acts as a heat sink.

A duct 460 is located adjacent to heat sink wall 450. Fan 442 is positioned near the midpoint of duct 460 and blows ambient air into the duct. Fan 442 is positioned to direct air toward heat sink wall 450. This air flow against heat sink wall 450 dissipates heat that is transferred from the power electronics to the heat sink wall. The air flow from fan 442 is split by wall 450 into a first portion that flows upward through heat exchanger 430 and a second portion that flows downward through heat exchanger 431.

Duct 460 and heat exchanger 430 are open at the top of the drive to allow the upward flow of ambient air to exit. At the bottom of duct 460, ambient air that flows through heat exchanger 431 is directed by chute 461 to an opening at the back of the drive. A hinged flapper 462 hangs down from the top of the opening to cover the opening. When air is flowing downward through duct 460 and heat exchanger 431, the resulting air pressure in the duct moves flapper 462 outward, allowing the air to exit through the opening. When there is no air flowing downward through duct 460, flapper 462 covers the opening and consequently prevents anything (e.g., sand, dust, small animals, etc.) from entering the duct through the lower opening.

An awning 463 is positioned over flapper 462 to prevent high-speed direct external winds from closing the flapper, which would impede the flow of exhaust air from the duct. Awning 463 also limits the movement of the flapper. In one embodiment, an adjustment screw is threaded through awning 463. The adjustment screw 464 is turned to adjust the maximum amount of movement of flapper 462 away from the opening. The adjustment of the lower opening in this manner enables control of the amount of ambient air that flows downward through duct 460. This control allows the ratio of the upward and downward air flows through duct 460 to be balanced, thereby controlling the cooling (and the thermal profile) of the upper and lower compartments.

Referring to FIG. 5, a diagram illustrating the arrangement of components within lower compartment 411 is shown. It can be seen in this figure that air is moved within sealed compartment 411 by fans 441, 443 and 444. Fan 441 blows air from heat exchanger 431 into compartment 411, generally toward link reactor 415. A portion of the air flow from fan 441 is blown by fan 444 toward splitter 445, which splits this air flow into a portion that is directed toward link reactor 416, and another portion that is directed toward link reactor 417. Fan 443 draws air across link reactor 418 and into heat exchanger 431. The air within sealed compartment 411 is contained within the compartment and the heat exchanger, and does not come into contact with ambient air outside the compartment, so it cannot be contaminated by particulates or other contaminants in the ambient air.

The arrangement of the fans and link reactors (as well as the capacitors and any other components in the lower compartment) is designed to minimize the highest steady-state link reactor temperature. The depicted arrangement of components has several advantages. For example, this arrangement allows the components to fit into a relatively compact space. Further, this particular arrangement creates a lower airflow (in cubic feet per minute, or CFM) where the air from the plenum return side of the heat exchanger is cooler, and higher airflow on the plenum exhaust side, where the air is warmer. This achieves balanced heat removal (i.e., the amount of heat dissipated from each of the link reactors is approximately the same). Another advantage is that this arrangement does not require an individual cooling fan for each of the link reactors. By reducing the number of cooling fans, the system complexity and risk of failure are reduced.

Figure 6:
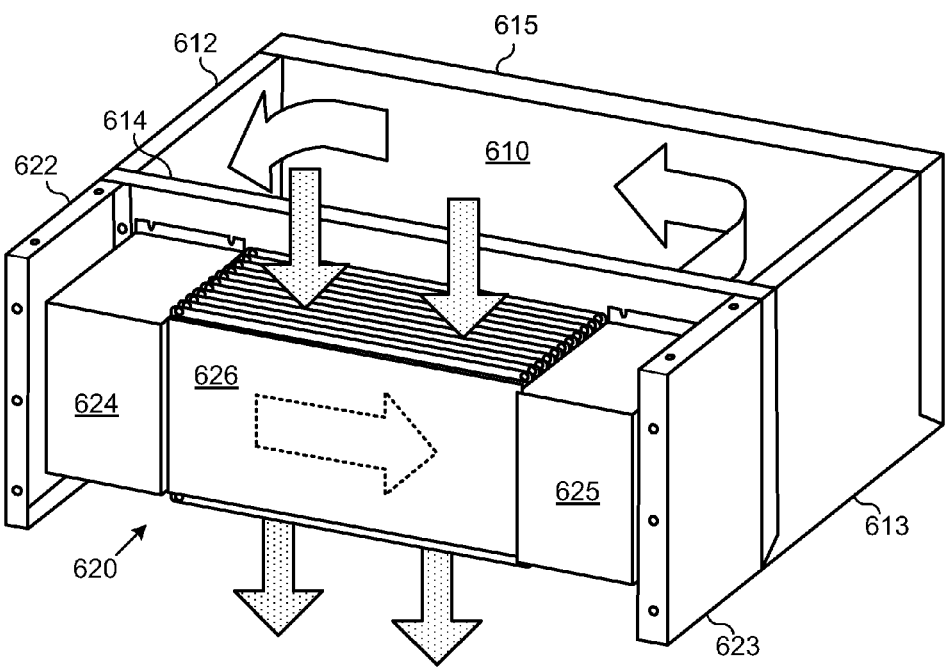
FIG. 6 is a diagram illustrating a perspective view of a heat exchanger coupled to a drive compartment in one embodiment.
Figure 7:
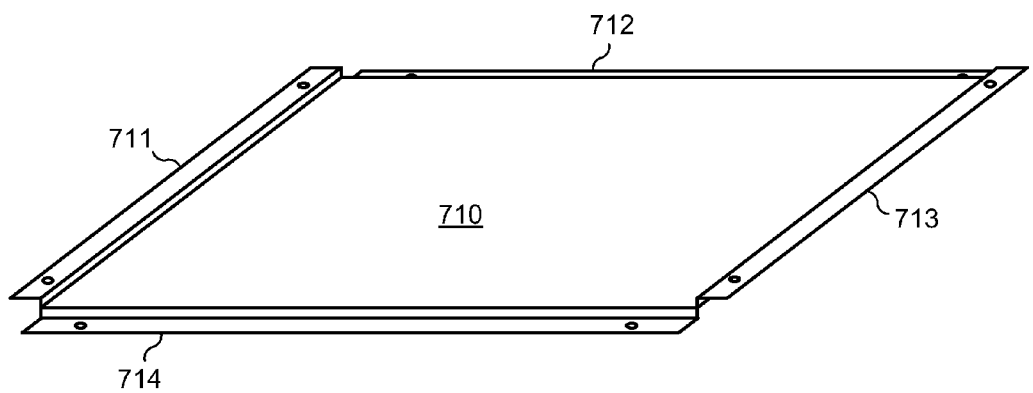
FIG. 7 is a diagram illustrating the structure of an individual heat exchanger plate in one embodiment.
Figure 8:
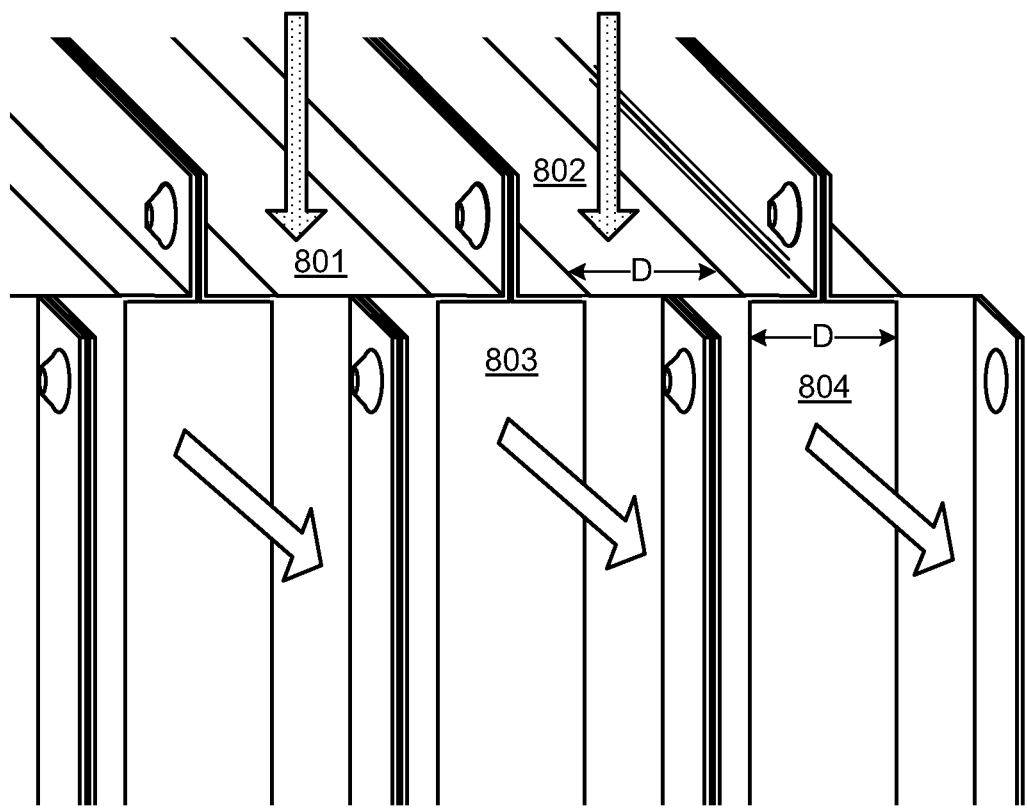
FIG. 8 is a diagram illustrating the structure of multiple connected plates in the crossflow portion of a heat exchanger in one embodiment.

The heat exchangers that are used in the sealed drive system may have various different configurations. One exemplary configuration is illustrated in FIGS. 6-8. This configuration is an air-to-air crossflow arrangement in which the air internal to the sealed chamber is separated from the external cooling air by a series of parallel plates. This configuration provides improved heat transfer from the internal air to the external cooling air by increasing the rate of airflow through the heat exchanger (increasing cross-sectional area of the passageways and thereby reducing pressure drops through the passageways) and by increasing the surface area of the passageways in comparison to conventional shell and tube heat exchangers. The improved airflow increases air velocities and turnover in the sealed compartments, and reduces fan loading in the system.

Referring to FIG. 6, a perspective view of a heat exchanger coupled to a drive compartment is shown. The upper wall of the sealed compartment is removed in the figure. The front of the heat exchanger duct is also removed to show the heat exchanger.

The sealed compartment 610 is formed by side walls 612 and 613, front and rear walls 614 and 615 and top and bottom walls which are not shown in the figure. Heat exchanger 620 is mounted on the exterior of front wall 614 (the side facing outward from the sealed compartment). Heat exchanger 620 is positioned within a duct that is formed by sealed compartment wall 614, duct side walls 622 and 623, and a front duct wall which is not shown in the figure. In this example, cooling air flows downward through the duct, as shown by the vertical arrows. This would correspond to lower heat exchanger 431 in FIG. 4. The same configuration can be used for upper heat exchanger 430, but the cooling air would flow upward through the heat exchanger, rather than downward.

Heat exchanger 620 has two headers (624, 625) and a series of plates (e.g., 626). The plates are oriented in parallel positions, and adjacent plates are connected on two sides to form alternating vertical and horizontal passageways between the plates. For example, if the first two plates are connected along the top and bottom (horizontal) sides to form a horizontal passageway, the second and third plates will be connected along their vertical sides to form a vertical passageway. The third and fourth plates will be connected along their top and bottom sides to form another horizontal passageway. This is repeated for the remainder of the plates to form a series of alternating vertical and horizontal passageways, wherein each pair of adjacent passageways (one vertical and one horizontal) is separated by one of the plates.

Referring to FIGS. 7 and 8, the structure of the individual plates (FIG. 7) and the passageways formed by the connected plates (FIG. 8) are shown. In this embodiment, each plate 626 is formed from a metal such as aluminum. The plate has a flat central portion 710, with a connecting portion (711-714) on each edge. The connecting portions on the left and right edges (711 and 713) are offset in one direction (upward in the figure), while connecting portions (712 and 714) on the other two edges are offset in the opposite direction (downward in the figure). In this embodiment, the plates are identical, but this is not necessary in alternative embodiments.

The plates in this embodiment are assembled without a frame. The plates are instead connected directly to each other by any suitable means, such as welding, brazing, rivets, epoxy, etc. The plates and passageways may alternatively be formed by extrusion. The connecting portions may be configured in any manner that is suitable for attaching the respective connecting portions. When two adjacent plates are connected to each other, they are positioned so that the edges to be connected extend toward each other. The connecting portions thereby hold the central portions of the adjacent plates at a predetermined distance D from each other (i.e., the combined offsets of the two connecting portions). This forms the vertical passageways (e.g., 801, 802) and horizontal passageways (e.g., 803, 804) of the heat exchanger.

In an alternative embodiment, the plates are not all connected to each other in a frameless assembly. Instead, pairs of plates may be connected to each other to form rectangular tubular passageways. These tubular structures can be positioned between the headers. The header walls to which the tubular structures are connected are slotted to allow air in the headers to circulate through the tubular passageways. The portions of the slotted walls between the tubular structures seal the spaces between the structures to form the vertical duct passageways.

The plates (e.g., 626) may have various features to increase their efficiency, facilitate their assembly, and provide other advantages. For instance, the central portion of the plate may be textured, or may have fins, corrugations or other structures that increase the surface area of the plate or create turbulence in the air flow over the plate in order to promote greater convection near the surface of the plate, thereby increasing the amount of heat flux through the plate. It should be noted that some types of these structures may require the use of particular manufacturing techniques. For instance, it may be a relatively simple and straightforward matter to construct plates having fins by extrusion, while it may be difficult or even impossible to do so through metal stamping techniques.

Figure 9:
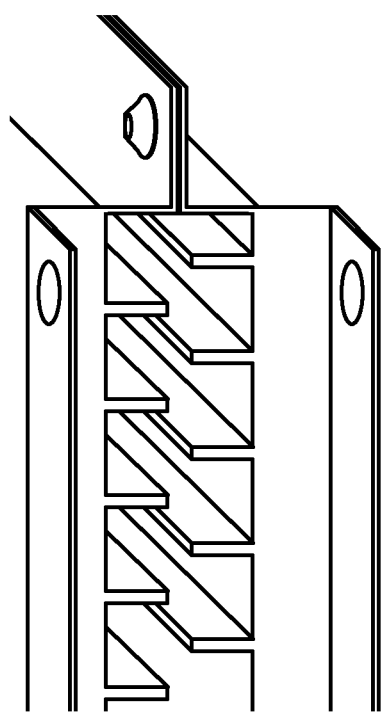
FIG. 9 is a diagram illustrating the use of fins on heat exchanger plates in one embodiment.

Referring to FIG. 9, an exemplary embodiment is shown in which fins extend from the central portions of the plates. In this embodiment, the fins only extend from one side of each plate. The fins would therefore increase the surface area in every other passageway (e.g., only the horizontal passageways). The finned plates could be manufactured, for example, using extrusion techniques. In alternative embodiments, the fins could extend from both sides of the plates, increasing the surface are in both the horizontal and vertical passageways. In this case, the fins would run in different (perpendicular) directions on opposite sides of the plates. This design would require more complicated manufacturing techniques than extrusion and would likely be more difficult and costly to manufacture. In addition to heat dissipating structures such as fins, the plates may include dimples or other interlocking features to aid in properly aligning the plates when they are assembled.

The stack of connected plates form a crossflow portion of the heat exchanger. The sides of the crossflow portion are connected to headers 624 and 625. The plates are sealed against the headers so that air within the headers can only flow into and out of the horizontal passageways. Air in the vertical passageways cannot leak into the headers or the horizontal passageways. Headers 624 and 625 are sealed against front wall 614 of sealed compartment 610, and openings in wall 614 allow the air in the sealed compartment to flow through the headers and horizontal passageways.

One or more fans are provided to circulate the air contained in the sealed compartment. For instance, fans may be positioned at the openings in wall 614. The fans may circulate the air within sealed compartment 610 into header 624, through the horizontal passageways formed by the plates (e.g., 626), into header 625, and then back into the sealed compartment. This air movement is depicted in FIG. 6 by the horizontal arrows (the dotted arrow indicates flow through the horizontal passageways). The air within the sealed compartment and heat exchanger cannot escape to the exterior of these components.

As the air inside the sealed compartment circulates through the horizontal passageways, external cooling air circulates through the vertical passageways of the heat exchanger's crossflow portion. Because the heat exchanger and sealed compartment are sealed, none of the external cooling air can enter the sealed compartment, and none of the contaminants that are in the external cooling air (e.g., sand, moisture, etc.) can enter the sealed compartment. As the internal air and external cooling air pass through the passageways, heat from the internal air passes through the thin plates that form the walls of the passageways to the external cooling air. The external air then carries the heat through the duct to an outlet, where it is discharged from the duct.

Numerous variations of the exemplary design described above are possible. For example, while a crossflow heat exchanger is used in the above embodiment because of geometry considerations, a counterflow heat exchanger could be used to increase efficiency. Refrigerants could also be used, although they may be viewed as a maintenance liability. The single flapper valve described above could be replaced with any number of valves, or this component could be eliminated in alternative embodiments. Further, the flapper could be actively actuated (e.g., based on real-time logged system temperatures) rather than allowing it to be opened by air pressure in the duct. Still further, entirely different mechanisms could be used in place of the flapper mechanism.

Various options also exist for airflow management within the bottom compartment of the drive. For instance, HVAC duct could be used to provide more flexibility in the placement of inductors, and to provide direct access to cool air for each inductor. As another option, an airseal wall could be created with material removed around the link reactors, such that the heat exchanger fans would induce a pressure drop across the airseal, forcing air to flow through the inductors. This would provide a high level of flow control but would likely limit the flow volume considerably. The topology of the ambient air flow structure could also be changed. For example, instead of external air being forced against a heat sink and then split into separate upper and lower flow regimes, each heat exchanger could have one dedicated fan for external air.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A sealed drive system for downhole electric equipment, the sealed drive system comprising:
   two or more electrical components configured to produce an electrical output waveform that drives the downhole electric equipment;
   an enclosure forming two or more sealed compartments, wherein each of the two or more sealed compartments prevents external air outside of the two or more sealed compartments from entering the two or more sealed compartments, and wherein at least a respective one of the two or more electrical components is contained within each of the two or more sealed compartments;
   two or more air-to-air heat exchangers, each of the two or more air-to-air heat exchangers adjacent to a respective one of the two or more sealed compartments, wherein the two or more air-to-air heat exchangers cools internal air within each of the two or more sealed compartments without allowing the external air to enter the two or more sealed compartments; and
   a duct which is adjacent to the two or more sealed compartments, wherein the two or more air-to-air heat exchangers are positioned within the duct, wherein the external air flows through the duct and through each of the two or more air-to-air heat exchangers wherein the duct has at least one wall in common with the two or more sealed compartments, wherein the two or more of the electrical components in the two or more sealed compartments are positioned in thermal contact with the at least one common wall and thereby dissipate heat by conduction through the at least one common wall,
   wherein the two or more air-to-air heat exchangers each comprise a crossflow portion having a first set of passageways through which the internal air inside of the two or more sealed compartments flows and a second set of passageways through which the external air flows, the two or more air-to-air heat exchanger each further comprising a plurality of plates, wherein each plate has a substantially flat central portion, wherein the central portions of the plates are substantially parallel, and wherein for each of the plates, the central portion forms a wall between one of the passageways in the first set and one of the passageways in the second set.

2. The sealed drive system of claim 1, wherein the two or more electrical components include one or more switching components and one or more link reactors, wherein the one or more switching components are contained in a first one of the two or more sealed compartments and the one or more link reactors are contained in a second one of the two or more sealed compartments.

3. The sealed drive system of claim 1, wherein each of the plates is identical.

4. The sealed drive system of claim 3, wherein each of the plates has two pairs of connecting portions, wherein each pair of two pairs of connecting portions are on opposite edges of the plate, wherein a first one of the two pairs of connecting portions is offset in a first direction, and a second one of the two pairs of connecting portions is offset in a second direction opposite the first direction.

5. The sealed drive system of claim 1, wherein for each of the plates, the central portion has one or more fins extending therefrom, the one or more fins extending into one of the first and second sets of passageways.

6. The sealed drive system of claim 1, wherein for each of the plates, the central portion is corrugated.

7. The sealed drive system of claim 1, further comprising one or more external fans outside of the two or more sealed compartments which direct the external air through the duct and through the two or more air-to-air heat exchangers.

8. The sealed drive system of claim 7, further comprising one or more internal fans inside of the two or more sealed compartments which direct internal air through the two or more air-to-air heat exchangers.

9. The sealed drive system of claim 8, wherein at least one of the one or more external fans outside of the two or more sealed compartments is positioned at an external air inlet at a midpoint of the duct, wherein a first portion of the external air flows through a first one of the two or more air-to-air heat exchangers to a first external air outlet and a second portion of the external air flows through a second one of the two or more air-to-air heat exchangers to a second external air outlet.

10. The sealed drive system of claim 9, wherein the first external air outlet has an adjustable valve that regulates an amount of the external air exiting the duct through the first external air outlet and thereby controls a ratio of the first portion of the external air to the second portion of the external air.

11. A sealed drive system for an electric submersible pump, the sealed drive system comprising:
  an upper sealed compartment and a lower sealed compartment, wherein the upper sealed compartment prevents air external to the upper sealed compartment from entering the upper sealed compartment and the lower sealed compartment prevents the air external to the lower sealed compartment from entering the lower sealed compartment, wherein the upper sealed compartment encloses a first set of electrical components and the lower sealed compartment encloses a second set of electrical components;
  a duct adjacent the upper and lower sealed compartments and sharing a common wall with the upper and lower sealed compartments;
  an upper heat exchanger positioned in the duct and mounted on the common wall, wherein a first portion of air internal to the upper sealed compartment flows through the upper heat exchanger; and
  a lower heat exchanger positioned in the duct and mounted on the common wall, wherein a second portion of the air internal to the lower sealed compartment flows through the lower heat exchanger;
  wherein each of the upper and lower heat exchangers is an air-to-air crossflow heat exchanger having a plurality of crossflow passageways formed between a series of plates having substantially flat, parallel central portions.

12. The sealed drive system of claim 11, wherein the series of plates forming the crossflow passageways of each of the upper and lower heat exchangers are identically formed.

13. The sealed drive system of claim 11, wherein each of the crossflow passageways through each of the upper and lower heat exchangers is substantially rectangular in cross-section.

14. The sealed drive system of claim 11, further comprising three or more fans, wherein at least a first one of the three or more fans circulates air in the upper sealed compartment through the upper heat exchanger, wherein at least a second one of the three or more fans circulates air in the lower sealed compartment through the lower heat exchanger, and wherein at least a third one of the three or more fans circulates the air external to the upper and lower sealed compartments through the duct and through the upper and lower heat exchangers.

15. The sealed drive system of claim 11, wherein the sealed drive system further comprises a variable speed drive, and wherein the variable speed drive is coupled to the first and second sets of electrical components to provide power to an electric submersible pump.

\* \* \* \* \*